United States Patent
Kasa et al.

(10) Patent No.: US 9,188,879 B2
(45) Date of Patent: Nov. 17, 2015

(54) SUBSTRATE HOLDING APPARATUS, PATTERN TRANSFER APPARATUS, AND PATTERN TRANSFER METHOD

(75) Inventors: Kentaro Kasa, Kanagawa-ken (JP); Manabu Takakuwa, Kanagawa-ken (JP); Ryoichi Inanami, Kanagawa-ken (JP); Kazuto Matsuki, Tokyo (JP); Tetsuro Nakasugi, Kanagawa-ken (JP); Hiroshi Koizumi, Kanagawa-ken (JP); Minoru Inomoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 509 days.

(21) Appl. No.: 13/600,123

(22) Filed: Aug. 30, 2012

(65) Prior Publication Data

US 2013/0222782 A1   Aug. 29, 2013

(30) Foreign Application Priority Data

Feb. 24, 2012   (JP) .................. 2012-039074

(51) Int. Cl.
*G03B 27/58*   (2006.01)
*G03F 7/20*   (2006.01)

(52) U.S. Cl.
CPC ............ *G03F 7/70783* (2013.01); *G03F 7/707* (2013.01)

(58) Field of Classification Search
CPC ... G03F 7/707; G03F 7/70783; G03F 7/7085; G03F 7/70775; G03F 7/70716; G03F 7/70758; G03F 7/70691; G03F 7/70725
USPC .................. 355/72, 52, 53, 30, 554
See application file for complete search history.

(56) References Cited

U.S. PATENT DOCUMENTS

| 5,094,536 A | 3/1992 | MacDonald et al. |
| 5,374,829 A | 12/1994 | Sakamoto et al. |
| 6,556,281 B1* | 4/2003 | Govil et al. .......... 355/72 |
| 2010/0173250 A1* | 7/2010 | Scharnweber .......... 430/322 |

FOREIGN PATENT DOCUMENTS

| JP | 5-190414 | 7/1993 |
| JP | 6-169007 | 6/1994 |
| JP | 10-150097 | 6/1998 |
| JP | 2005-277117 | 10/2005 |
| JP | 2007-80935 | 3/2007 |
| JP | 2007-123560 | 5/2007 |
| JP | 2009-81267 | 4/2009 |
| JP | 2009-168860 | 7/2009 |

(Continued)

OTHER PUBLICATIONS

Machin translation of JP 2009168860 A.*

(Continued)

*Primary Examiner* — Mesfin T Asfaw
(74) *Attorney, Agent, or Firm* — Finnegan, Henderson, Farabow, Garrett & Dunner, L.L.P.

(57) ABSTRACT

According to one embodiment, a substrate holding apparatus includes a main unit and a plurality of first support units. The main unit has a major surface. The main unit has a plate configuration. The first support units are disposed on the major surface. Each of the first support units includes a suction-holding unit capable of holding a substrate by suction. The suction-holding unit is movable along a first direction perpendicular to the major surface and a second direction parallel to the major surface.

20 Claims, 12 Drawing Sheets

(56) References Cited

FOREIGN PATENT DOCUMENTS

JP         4985392      5/2012
WO    WO 03/052804 A1   6/2003

OTHER PUBLICATIONS

Decision of Refusal issued by the Japanese Patent Office on Sep. 18, 2014, for Japanese Patent Application No. 2012-039074, and English-language translation thereof.

Notification of Reason(s) for Refusal issued by the Japanese Patent Office on Jun. 24, 2014, for Japanese Patent Application No. 2012-039074, and English-language translation thereof.

Notification of Reason(s) for Refusal issued by the Japanese Patent Office on Sep. 4, 2015, for Japanese Patent Application No. 2012-039074, and English-language translation thereof.

Notification of Reason(s) for Refusal issued by the Japanese Patent Office on Sep. 4, 2015, for Japanese Patent Application No. 2014-254616, and English-language translation thereof.

* cited by examiner

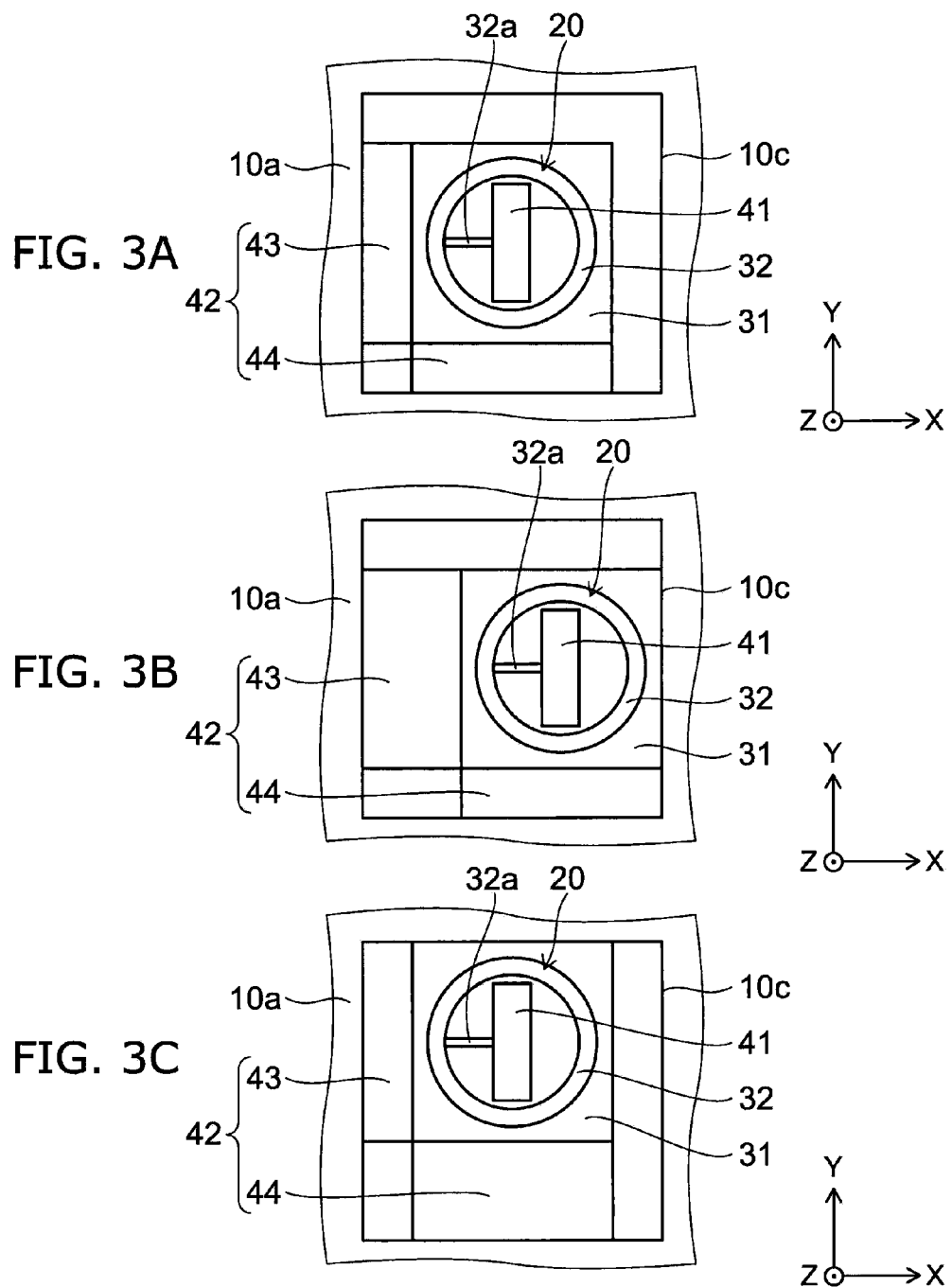

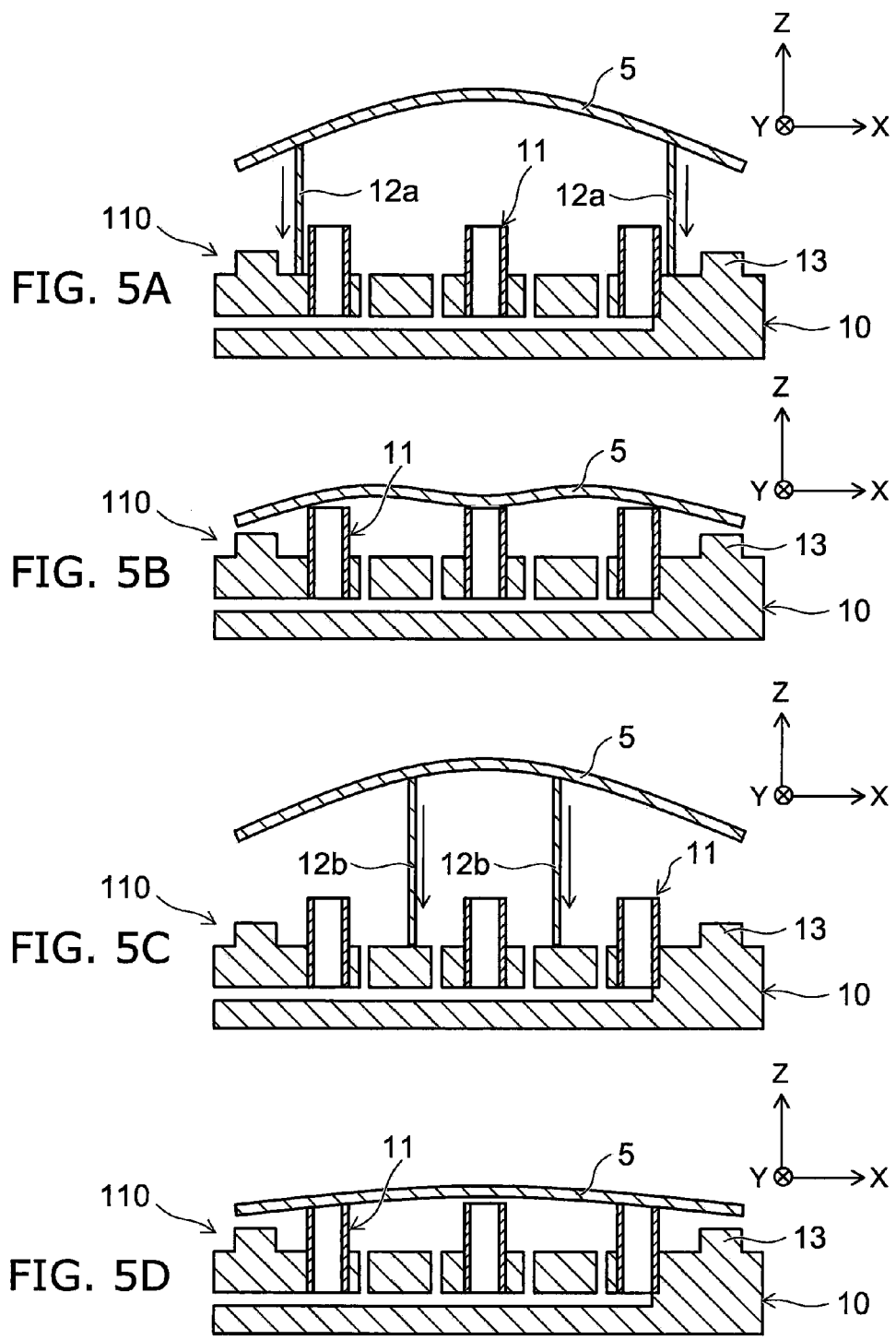

SUBSTRATE HOLDING APPARATUS, PATTERN TRANSFER APPARATUS, AND PATTERN TRANSFER METHOD

CROSS-REFERENCE TO RELATED APPLICATIONS

This application is based upon and claims the benefit of priority from the prior Japanese Patent Application No. 2012-039074, filed on Feb. 24, 2012; the entire contents of which are incorporated herein by reference.

FIELD

Embodiments described herein relate generally to a substrate holding apparatus and a pattern transfer apparatus, and a pattern transfer method.

BACKGROUND

A pattern transfer apparatus that transfers a prescribed pattern onto a substrate (a semiconductor wafer) is used in a semiconductor lithography process. The pattern transfer apparatus includes a substrate holding apparatus that attachably and removably holds the substrate. In the semiconductor lithography process, it is desirable to increase the precision (called the overlay precision hereinbelow) in the case where a new pattern is transferred onto a pattern that is already formed in the substrate. Distortion of the substrate is one factor that reduces the overlay precision. In the substrate holding apparatus and the pattern transfer apparatus, it is desirable to appropriately adjust the distortion of the substrate.

BRIEF DESCRIPTION OF THE DRAWINGS

FIG. 3A to FIG. 3C are schematic top views illustrating the configuration of a portion of the substrate holding apparatus according to the first embodiment;

FIG. 5A to FIG. 5D are schematic cross-sectional views illustrating the configuration of the substrate holding apparatus according to the first embodiment;

DETAILED DESCRIPTION

Figure 1A:
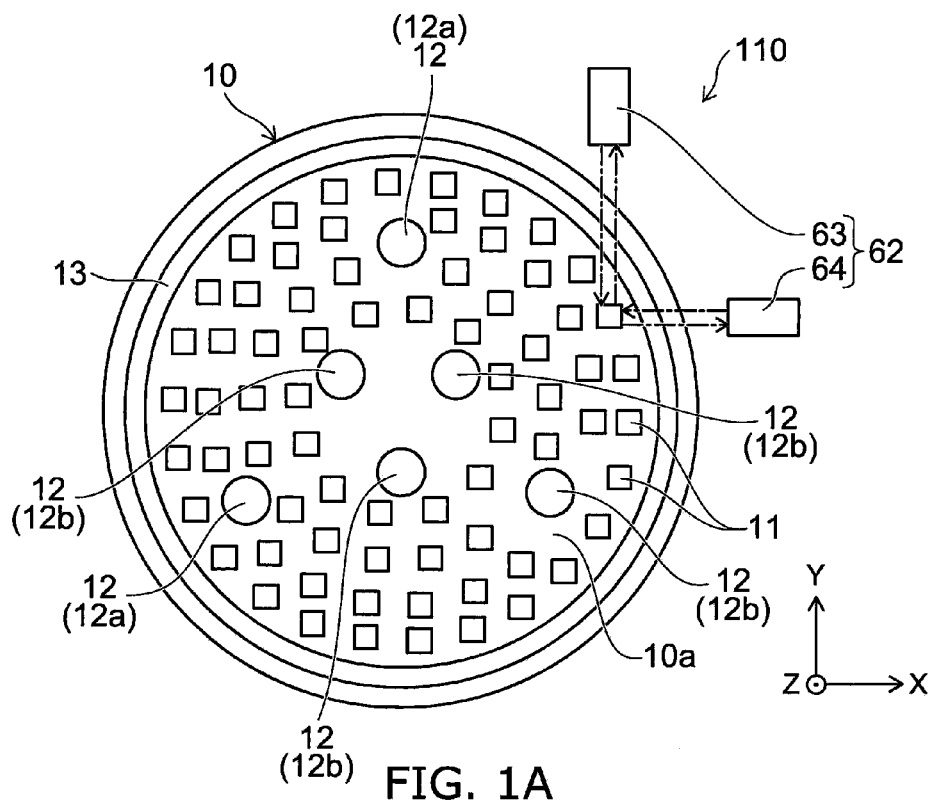
FIG. 1A and FIG. 1B are schematic views illustrating the configuration of a substrate holding apparatus according to a first embodiment.

According to one embodiment, a substrate holding apparatus includes a main unit and a plurality of first support units. The main unit has a major surface. The main unit has a plate configuration. The first support units are disposed on the major surface. Each of the first support units includes a suction-holding unit capable of holding a substrate by suction. The suction-holding unit is movable along a first direction perpendicular to the major surface and a second direction parallel to the major surface.

According to another embodiment, a pattern transfer apparatus includes a substrate holding apparatus, a master form holding unit, a transfer unit and a control unit. The substrate holding apparatus includes a main unit and a plurality of first support units. The main unit has a major surface. The main unit has a plate configuration. The first support units are disposed on the major surface. Each of the first support units includes a suction-holding unit capable of holding a substrate by suction. The suction-holding unit is movable along a first direction perpendicular to the major surface and a second direction parallel to the major surface. The master form holding unit is configured to attachably and removably hold a master form. A pattern is formed in the master form. The transfer unit is configured to transfer the pattern onto the substrate. The control unit is configured to control movement of the suction-holding unit in the first direction and the second direction for each of the first support units.

According to another embodiment, a pattern transfer method that uses a pattern transfer apparatus is disclosed. The pattern transfer apparatus includes a substrate holding apparatus, a master form holding unit, a transfer unit and a control unit. The substrate holding apparatus includes a main unit and a plurality of first support units. The main unit has a major surface. The main unit has a plate configuration. The first support units are disposed on the major surface. Each of the first support units includes a suction-holding unit capable of holding a substrate by suction. The suction-holding unit is movable along a first direction perpendicular to the major surface and a second direction parallel to the major surface. The master form holding unit is configured to attachably and removably hold a master form. A pattern is formed in the master form. The transfer unit is configured to transfer the pattern onto the substrate. The control unit is configured to control movement of the suction-holding unit in the first direction and the second direction for each of the first support units. The method can cause the substrate holding apparatus to hold the substrate. The method can cause the master form holding unit to hold the master form. The method can adjust distortion of the substrate by controlling the movement of the suction-holding unit in the first direction and the second direction for each of the first support units. In addition, the method can transfer the pattern onto the substrate.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Also, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
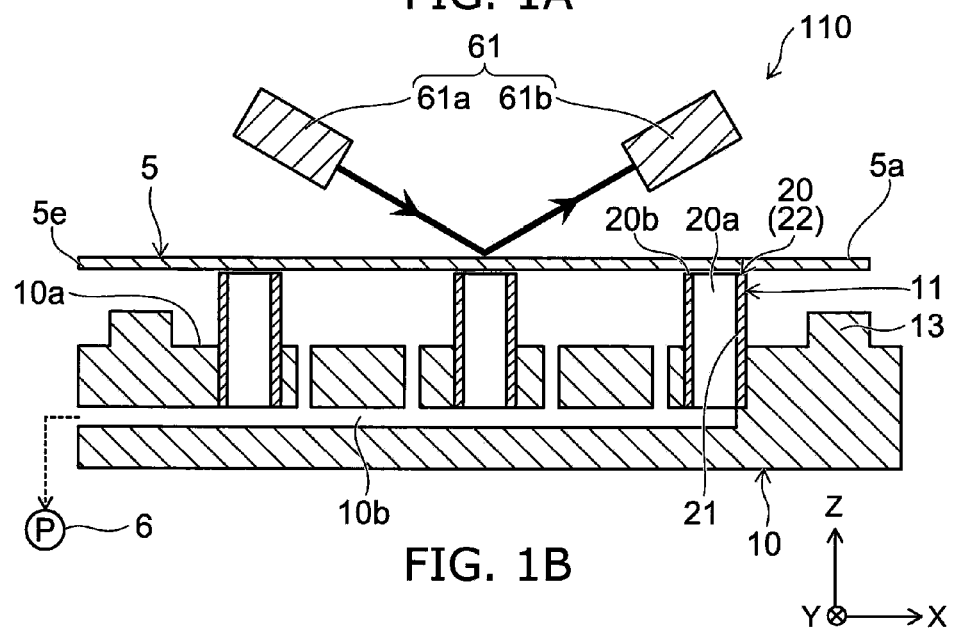

FIG. 1A and FIG. 1B are schematic views illustrating the configuration of a substrate holding apparatus according to a first embodiment.

FIG. 1A is a schematic top view; and FIG. 1B is a schematic cross-sectional view.

As illustrated in FIG. 1A and FIG. 1B, the substrate holding apparatus 110 according to the embodiment includes a main unit 10 and multiple first support units 11.

The substrate holding apparatus 110 attachably and removably holds a substrate 5. For example, the substrate 5 has a plate configuration. Specifically, the substrate 5 has a disc configuration. For example, the substrate 5 is a semiconductor wafer. For example, the substrate holding apparatus 110 is used to hold the substrate 5 onto which a pattern is transferred in a semiconductor lithography process.

For example, the main unit 10 has a plate configuration. For example, the main unit 10 has a disc configuration. The main unit 10 has a major surface 10a opposing the substrate 5. For example, the diameter of the major surface 10a of the main unit 10 is larger than the diameter of the substrate 5. The surface area of the major surface 10a is greater than the surface area of a major surface 5a of the substrate 5.

Hereinafter, a first direction perpendicular to the major surface 10a is taken as a Z-axis direction. One direction perpendicular to the Z-axis direction is taken as an X-axis direction. A direction perpendicular to the Z-axis direction and the X-axis direction is taken as a Y-axis direction. The X-axis direction is, for example, a second direction, and the Y-axis direction is a third direction.

The multiple first support units 11 are provided in the main unit 10. For example, the multiple first support units 11 are disposed in a prescribed pattern on the major surface 10a. Each of the first support units 11 has a tip portion 20 that has a suction aperture 20a to perform suction. For example, the first support unit 11 includes a suction pipe line 21. For example, the first support unit 11 has a tubular configuration. For example, the tip portion 20 is a tip surface 20b of the first support unit 11 which has the tubular configuration. For example, the suction aperture 20a is a portion of the suction pipe line 21 exposed at the tip surface 20b. The first support unit 11 supports the substrate 5 which has the plate configuration by causing the substrate 5 to be held by suction to the tip portion 20 by the suction of the suction aperture 20a. In other words, the tip portion 20 of the first support unit 11 is a suction-holding unit 22 which is capable of holding the substrate 5 by suction.

The suction pipe lines 21 are connected to an evacuation pipe line 10b that is provided in the interior of the main unit 10. For example, the suction pipe lines 21 of the multiple first support units 11 are collected into one pipe line at the evacuation pipe line 10b. For example, the evacuation pipe line 10b is connected to a pump 6 via a not-illustrated pipe, etc. Thereby, paths are formed from the pump 6 to the suction apertures 20a via the evacuation pipe line 10b and the suction pipe lines 21. The pump 6 applies a negative pressure (reduced pressure) to the evacuation pipe line 10b. Thereby, the suction by the suction apertures 20a is performed by the driving of the pump 6.

For example, the substrate 5 is suction-held by the multiple first support units 11 by the interiors of the pipe lines from the pump 6 to the suction apertures 20a having a negative pressure. For example, by returning the interiors of the pipe lines from the pump 6 to the suction apertures 20a to atmospheric pressure, the holding of the substrate 5 by the suction by the multiple first support units 11 is released. Thereby, the substrate 5 is attachably and removably held in the substrate holding apparatus 110.

For example, the pump 6 may be built-into the substrate holding apparatus 110. In this example, the suction through the suction apertures 20a of the multiple first support units 11 is performed simultaneously by the driving of the pump 6. For example, the suction apertures 20a that perform the suction may be selected by providing a valve that is configured to open and close the suction pipe line 21 in each of the multiple first support units 11. Further, the suction apertures 20a that perform the suction may be selected by providing a pump for each of the multiple first support units 11 and controlling the driving of these pumps.

Figures 2A, 2B:
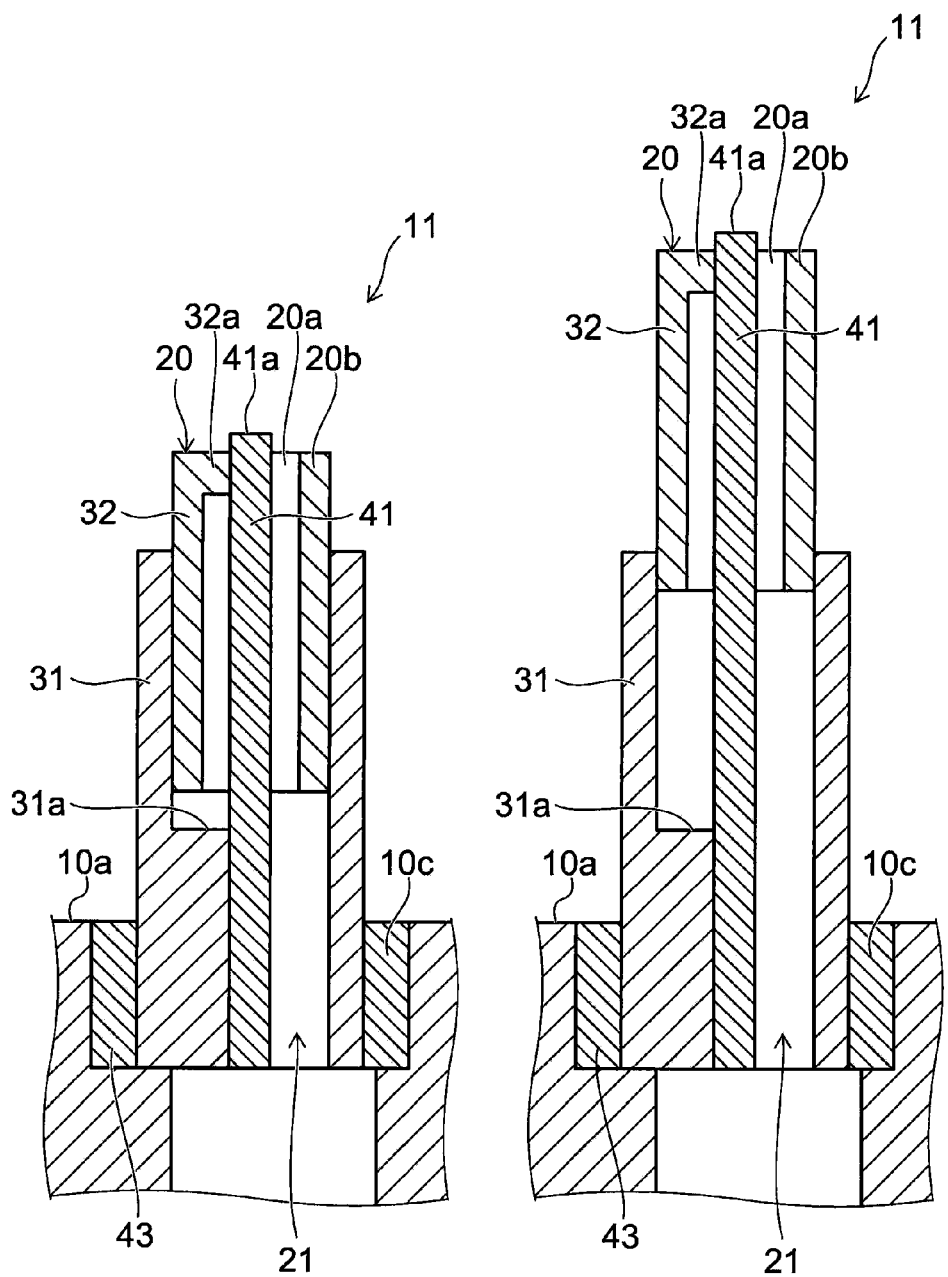
FIG. 2A and FIG. 2B are schematic cross-sectional views illustrating the configuration of a portion of the substrate holding apparatus according to the first embodiment.

FIG. 2A and FIG. 2B are schematic cross-sectional views illustrating the configuration of a portion of the substrate holding apparatus according to the first embodiment.

As illustrated in FIG. 2A and FIG. 2B, for example, the first support unit 11 includes a first tubular unit 31, a second tubular unit 32, and a first perpendicular direction drive unit 41.

For example, the first tubular unit 31 and the second tubular unit 32 have tubular configurations along the Z-axis direction. The first tubular unit 31 is mounted to the main unit 10. For example, the inner diameter of the first tubular unit 31 is substantially the same as the outer diameter of the second tubular unit 32. The second tubular unit 32 fits in the interior of the first tubular unit 31. The second tubular unit 32 is guided by the first tubular unit 31 and moves in the Z-axis direction. In this example, the tip portion 20 is formed in the second tubular unit 32. The suction pipe line 21 is formed of the interior space of the first tubular unit 31 and the interior space of the second tubular unit 32. The first tubular unit 31 has a protruding portion 31a that protrudes inward. The second tubular unit 32 has a protruding portion 32a that protrudes inward.

For example, a piezoelectric element is used for the first perpendicular direction drive unit 41. For example, the first perpendicular direction drive unit 41 expands and contracts in the Z-axis direction according to a voltage that is input. One end of the first perpendicular direction drive unit 41 is fixed to the first tubular unit 31 via the protruding portion 31a. One other end of the first perpendicular direction drive unit 41 is fixed to the second tubular unit 32 via the protruding portion 32a. Accordingly, the second tubular unit 32 moves in the Z-axis direction when the first perpendicular direction drive unit 41 is caused to expand and contract.

A tip 41a of the first perpendicular direction drive unit 41 protrudes slightly more than the tip surface 20b. Thus, the contact surface area with the substrate 5 is smaller than in the case where the tip surface 20b is caused to contact the substrate 5. Thereby, in the case where the substrate 5 is supported by the first support units 11, scratching of the substrate 5 can be suppressed. In this example, the tip 41a is formed in a planar configuration.

The tip portion 20 (the suction-holding unit 22) is movable along the Z-axis direction between a first state in which the height of the tip portion 20 along the Z-axis direction from the major surface 10a is low and a second state in which the height of the tip portion 20 along the Z-axis direction from the major surface 10a is higher than in the first state.

Herein, the position of the tip portion 20 in the first state is called the reference position. The position of the tip portion 20 in the second state is called the protruding position. In other words, the first support unit 11 moves the tip portion 20 in the Z-axis direction between the reference position and the protruding position which is more distal to the major surface 10a than is the reference position. In this example, the reference position is, for example, the position illustrated in FIG. 2A. The protruding position is, for example, the position illustrated in FIG. 2B. In this example, the reference position is distal to the major surface 10a. For example, the protruding position is a position more distal to the major surface 10a than is the reference position. In other words, the distance between the major surface 10a and the protruding position is longer than the distance between the major surface 10a and the reference position. The movement amount of the tip portion 20 in the Z-axis direction (the extension amount of the first perpendicular direction drive unit 41) is, for example, not less than 100 μm and not more than 300 μm.

FIG. 3A to FIG. 3C are schematic top views illustrating the configuration of a portion of the substrate holding apparatus according to the first embodiment.

As illustrated in FIG. 3A to FIG. 3C, the first support unit 11 further includes a parallel direction drive unit 42 to move the tip portion 20 in directions parallel to the major surface 10a.

The parallel direction drive unit 42 includes an X-axis direction drive unit 43 (a second direction drive unit) that moves the tip portion 20 in the X-axis direction, and a Y-axis direction drive unit 44 (a third direction drive unit) that moves the tip portion 20 in the Y-axis direction.

For example, a tubular body having a quadrilateral column in which a through-hole having a circular columnar configuration is made is used for the first tubular unit 31. An opening 10c having a rectangular configuration is made in the main unit 10 to dispose the first support unit 11. For example, two side surfaces of the opening 10c face the X-axis direction; and the remaining two side surfaces face the Y-axis direction. A portion of the first support unit 11 enters the opening 10c. For example, two side surfaces of the first support unit 11 face the X-axis direction; and the remaining two side surfaces face the Y-axis direction.

The X-axis direction drive unit 43 is mounted to one of the side surfaces of the first tubular unit 31 that faces the X-axis direction. The X-axis direction drive unit 43 is mounted to a side surface of the opening 10c that faces the X-axis direction. In such a case, for example, the X-axis direction drive unit 43 is mounted to the opening 10c side surface to be slidable in the Y-axis direction via a not-illustrated rail, etc.

The Y-axis direction drive unit 44 is mounted to one of the side surfaces of the first tubular unit 31 that faces the Y-axis direction. The Y-axis direction drive unit 44 is mounted to a side surface of the opening 10c that faces the Y-axis direction. In such a case, for example, the Y-axis direction drive unit 44 is mounted to the opening 10c side surface to be slidable in the X-axis direction via a not-illustrated rail, etc.

Thus, the first support unit 11 is mounted to the main unit 10 to be movable along the X-axis direction and the Y-axis direction via the X-axis direction drive unit 43 and the Y-axis direction drive unit 44.

For example, piezoelectric elements are used for the X-axis direction drive unit 43 and the Y-axis direction drive unit 44. For example, the X-axis direction drive unit 43 expands and contracts in the X-axis direction according to a voltage that is input. For example, the Y-axis direction drive unit 44 expands and contracts in the Y-axis direction according to a voltage that is input.

FIG. 3A illustrates the state in which the X-axis direction drive unit 43 and the Y-axis direction drive unit 44 are most contracted. As illustrated in FIG. 3B, the first tubular unit 31 and the second tubular unit 32 move in the X-axis direction when the X-axis direction drive unit 43 is caused to extend. As illustrated in FIG. 3C, the first tubular unit 31 and the second tubular unit 32 move in the Y-axis direction when the Y-axis direction drive unit 44 is caused to extend.

Thus, the first support unit 11 moves the tip portion 20 in directions parallel to the major surface 10a (directions along the X-Y plane) by the driving of the X-axis direction drive unit 43 and the Y-axis direction drive unit 44. For example, the movement amount of the tip portion 20 in the X-axis direction (the extension amount of the X-axis direction drive unit 43) is not more than 10 μm. For example, the movement amount of the tip portion 20 in the Y-axis direction (the extension amount of the Y-axis direction drive unit 44) is not more than 10 μm.

The movement directions of the tip portion 20 along the X-Y plane are not limited to the X-axis direction and the Y-axis direction. For example, the tip portion 20 may be moved in a radial direction and a diametrical direction of the major surface 10a. The movement direction of the tip portion 20 may be any one or more directions along the X-Y plane.

The substrate holding apparatus 110 further includes multiple second support units 12. The second support units 12 are provided in the main unit 10. For example, the multiple second support units 12 are disposed in a prescribed pattern on the major surface 10a.

Figure 4A:
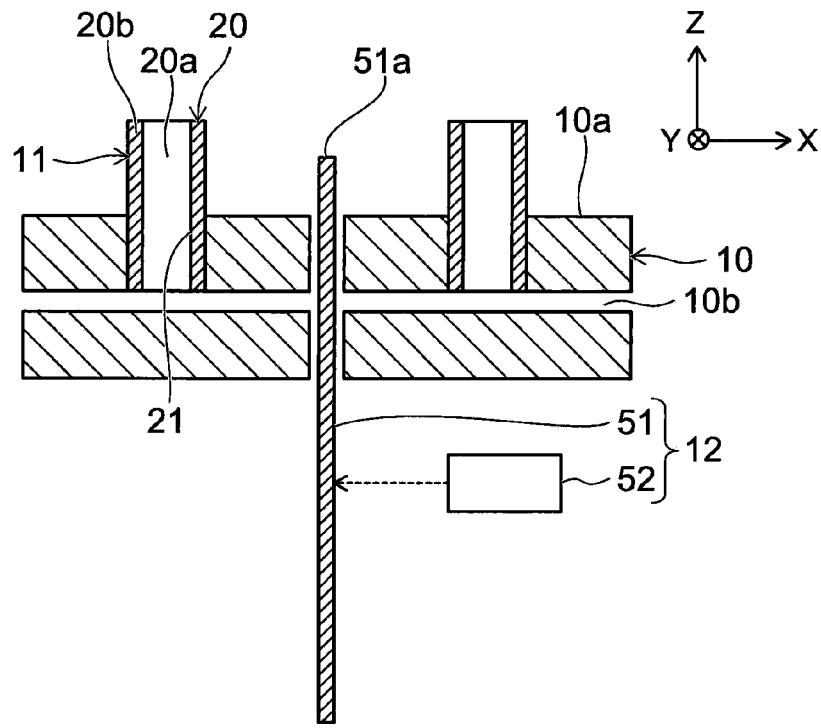
FIG. 4A and FIG. 4B are schematic cross-sectional views illustrating the configuration of a portion of the substrate holding apparatus according to the first embodiment.
Figure 4B:
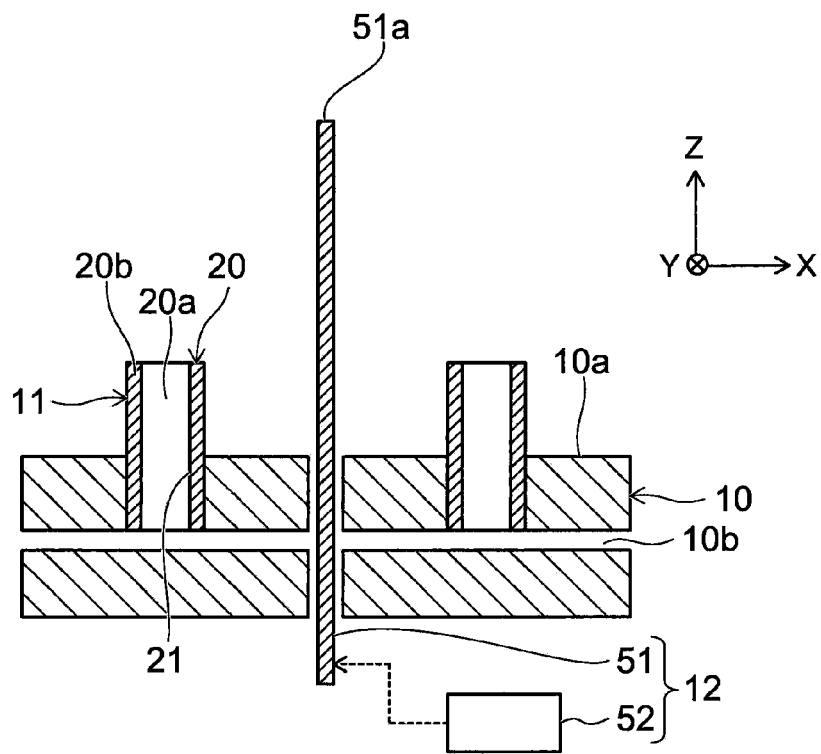

FIG. 4A and FIG. 4B are schematic cross-sectional views illustrating the configuration of a portion of the substrate holding apparatus according to the first embodiment.

As illustrated in FIG. 4A and FIG. 4B, for example, the second support unit 12 includes a movable portion 51 and a second perpendicular direction drive unit 52.

For example, the movable portion 51 has a rod configuration extending along the Z-axis direction. For example, the movable portion 51 is mounted to the main unit 10 to be movable in the Z-axis direction. The second perpendicular direction drive unit 52 moves the movable portion 51 in the Z-axis direction by applying a drive force to the movable portion 51. The second perpendicular direction drive unit 52 may include, for example, a piezoelectric element, a motor, a solenoid, etc.

The second support unit 12 has an end 51a in a direction from the position of the suction-holding unit 22 in the first state toward the position of the suction-holding unit 22 in the second state. For example, the end 51a is the upper end. The end 51a has a third state in which the height of the end 51a along the Z-axis direction from the major surface 10a is lower than the height in the second state, and a fourth state in which the height of the end 51a along the Z-axis direction from the major surface 10a is higher than the height in the second state.

Herein, the position of the end 51a in the third state is called the first position. The position of the end 51a in the fourth state is called the second position. In other words, the driving of the second perpendicular direction drive unit 52 causes the second support unit 12 to move the movable portion 51 in the Z-axis direction between the first position at which the first support unit 11 does not protrude further than when at the reference position and the second position at which the first support unit 11 protrudes more from the major surface 10a than when at the protruding position.

The end 51a of the movable portion 51 at the first position does not protrude further from the major surface 10a than does the tip portion 20 of the first support unit 11 at the reference position. The height from the major surface 10a of the end 51a at the first position may be substantially the same as the height from the major surface 10a of the tip portion 20 at the reference position. For example, the first position is the position illustrated in FIG. 4A.

The end 51a of the movable portion 51 at the second position protrudes further from the major surface 10a than does the tip portion 20 of the first support unit 11 at the protruding position. For example, the second position is the position illustrated in FIG. 4B.

The multiple second support units 12 support the substrate 5 by the ends 51a being caused to contact the substrate 5. For example, the second support units 12 are used when receiving the substrate 5 from a transfer apparatus (not illustrated), etc. For example, when receiving the substrate 5 in the substrate holding apparatus 110, the movable portions 51 of the multiple second support units 12 are moved to the second position; and the multiple second support units 12 support the substrate 5. The movable portion 51 of each of the multiple second support units 12 is moved from the second position to the first position in the state in which the substrate 5 is supported. The multiple second support units 12 deliver the substrate 5 that is supported to the multiple first support units 11 as the multiple second support units 12 move to the first position. Thus, the multiple second support units 12 receive the substrate 5 from the transfer apparatus and the like and guide the substrate 5 onto the multiple first support units 11. A mechanism to hold the substrate 5 by suction may be provided in each of the multiple second support units 12.

The substrate holding apparatus 110 further includes a third support unit 13. The third support unit 13 is provided on the major surface 10a of the main unit 10. For example, the third support unit 13 has a circular configuration surrounding the multiple support units 11 around the Z-axis direction. In this example, the third support unit 13 has a circular configuration surrounding each of the multiple first support units 11 and the multiple second support units 12 around the X-axis direction. For example, a protrusion having a circular ring configuration is used for the third support unit 13. For example, the diameter of the third support unit 13 corresponds to the diameter of the substrate 5. For example, the third support unit 13 is provided at a position opposing a peripheral portion 5e of the substrate 5 that is held by the multiple first support units 11. For example, the height from the major surface 10a of a tip 13a of the third support unit 13 is lower than the height from the major surface 10a of the tip portion 20 of the first support unit 11 at the reference position. For example, the third support unit 13 contacts the substrate 5 and supports the substrate 5 proximally to the peripheral portion 5e of the substrate 5 in the case of tilting, etc., of the substrate 5 that is placed on the multiple first support units 11. The third support unit 13 is not limited to the annular configuration and may be, for example, partially discontinuous.

The substrate holding apparatus 110 further includes a first measuring unit 61 and a second measuring unit 62.

The first measuring unit 61 measures the height from the major surface 10a for the tip portion 20 of each of the multiple first support units 11. For example, the first measuring unit 61 includes a light emitting unit 61a and a light receiving unit 61b. For example, the first measuring unit 61 includes an optical sensor that measures the height of the tip portion 20 by receiving the light irradiated from the light emitting unit 61a at the light receiving unit 61b and from the condition of the received light.

For example, the light emitting unit 61a and the light receiving unit 61b may be multiply provided to correspond to the multiple first support units 11. For example, the heights of the tip portions 20 of the multiple first support units 11 may be measured respectively by a plurality of the light emitting units 61a and a plurality of the light receiving units 61b. For example, the relative positions of the first measuring unit 61 and the multiple first support units 11 may be adjusted by moving the first measuring unit 61 or the main unit 10. Thereby, for example, the heights of the tip portions 20 of the multiple first support units 11 may be measured by one light emitting unit 61a and one light receiving unit 61b. The first measuring unit 61 is not limited to an optical sensor and may be any sensor capable of measuring the height of the tip portion 20.

The second measuring unit 62 measures the positions of the tip portions 20 of the multiple first support units 11 in directions along the X-Y plane. For example, the second measuring unit 62 includes an X-axis direction measuring unit 63 that measures the X-axis direction position of the tip portion 20, and a Y-axis direction measuring unit 64 that measures the Y-axis direction position of the tip portion 20. The X-axis direction measuring unit 63 and the Y-axis direction measuring unit 64 may include, for example, a reflection-type optical sensor. The X-axis direction measuring unit 63 and the Y-axis direction measuring unit 64 may be any sensor capable of measuring the position of the tip portion 20.

The positions of the tip portions 20 of the multiple first support units 11 may be measured by multiply providing the X-axis direction measuring unit 63 and the Y-axis direction measuring unit 64 to match the number of the multiple first support units 11. The positions of the tip portions 20 of the multiple first support units 11 may be measured using one X-axis direction measuring unit 63 and one Y-axis direction measuring unit 64 by adjusting the relative positions of the X-axis direction measuring unit 63 and each of the multiple first support units 11 and the relative positions of the Y-axis direction measuring unit 64 and each of the multiple first support units 11.

For example, the first measuring unit 61 is used to calibrate the zero point, the linearity of the operation, etc., for the first perpendicular direction drive unit 41. For example, the X-axis direction measuring unit 63 is used to calibrate the zero point, the linearity of the operation, etc., for the X-axis direction drive unit 43. Similarly, for example, the Y-axis direction measuring unit 64 is used to calibrate the zero point, the linearity of the operation, etc., for the Y-axis direction drive unit 44.

After causing the multiple first support units 11 to support the substrate 5 in the substrate holding apparatus 110, the first perpendicular direction drive unit 41 is driven to adjust the Z-axis direction positions of tip portions 20 of the multiple first support units 11. The X-axis direction drive unit 43 is driven to adjust the X-axis direction positions of the tip portions 20 of the multiple first support units 11. The Y-axis direction drive unit 44 is driven to adjust the Y-axis direction positions of the tip portions 20 of the multiple first support units 11.

Thus, in the substrate holding apparatus 110, the positions of the tip portions 20 in the X-axis direction, the Y-axis direction, and the Z-axis direction can be adjusted. Thereby, in the substrate holding apparatus 110, the distortion of the substrate 5 that is held can be appropriately adjusted. In other words, in the substrate holding apparatus 110, the distortion of the substrate 5 that is held can be appropriately suppressed.

For example, the adjustment of the positions of the tip portions 20 is performed based on the measurement information including the configuration of the substrate 5 that is pre-measured prior to being supported by the first support units 11 and/or the second support units 12. For example, the measurement information is pre-measured in a measuring apparatus that can measure the three-dimensional configuration of the substrate 5.

When adjusting the positions of the tip portions 20, for example, the positions of the tip portions 20 are measured by the first measuring unit 61 and the second measuring unit 62. Feedback is provided to drive the first perpendicular direction drive unit 41, the X-axis direction drive unit 43, and the Y-axis direction drive unit 44 based on the measurement results of the first measuring unit 61 and the second measuring unit 62. Thereby, the adjustment precision of the positions of the tip portions 20 increases; and the distortion of the substrate 5 can be suppressed more appropriately.

The case where the substrate 5 is supported by selectively using any of the multiple second support units 12 will now be described.

Here, the multiple second support units 12 are divided into two groups, i.e., a first group 12a and a second group 12b (referring to FIGS. 1A and 1B).

The first group 12a is the second support units 12 positioned relatively outward from the center of the major surface 10a. The second group 12b is the second support units 12 positioned relatively inward toward the center of the major surface 10a.

FIG. 5A to FIG. 5D are schematic cross-sectional views illustrating the configuration of the substrate holding apparatus according to the first embodiment.

As illustrated in FIG. 5A, a substrate 5 that is distorted to protrude upward proximal to the center is supported by the second support units 12 of the first group 12a.

As illustrated in FIG. 5B, the movable portions 51 of the second support units 12 of the first group 12a are moved from the second position to the first position to cause the multiple first support units 11 to support the substrate 5. In such a case, a relatively large distortion undesirably remains in the substrate 5.

As illustrated in FIG. 5C, the substrate 5 that is distorted to protrude upward proximal to the center is supported by the second support units 12 of the second group 12b.

As illustrated in FIG. 5D, the movable portions 51 of the second support units 12 of the second group 12b are moved from the second position to the first position to cause the multiple first support units 11 to support the substrate 5. In such a case, the distortion remaining in the substrate 5 is smaller than in the case where the first group 12a is used. FIG. 5B and FIG. 5D show an example of the end 51a of the movable portion 51 being located lower than the major surface 10a when moving the movable portion 51 of the second support unit 12 to the first position.

In the substrate holding apparatus 110, the configuration (the distortion) of the substrate 5 is pre-measured. Then, any of the multiple second support units 12 is appropriately selected according to the condition of the distortion of the substrate 5. Thereby, the distortion of the substrate 5 when supported by the multiple first support units 11 can be reduced.

Figure 6A:
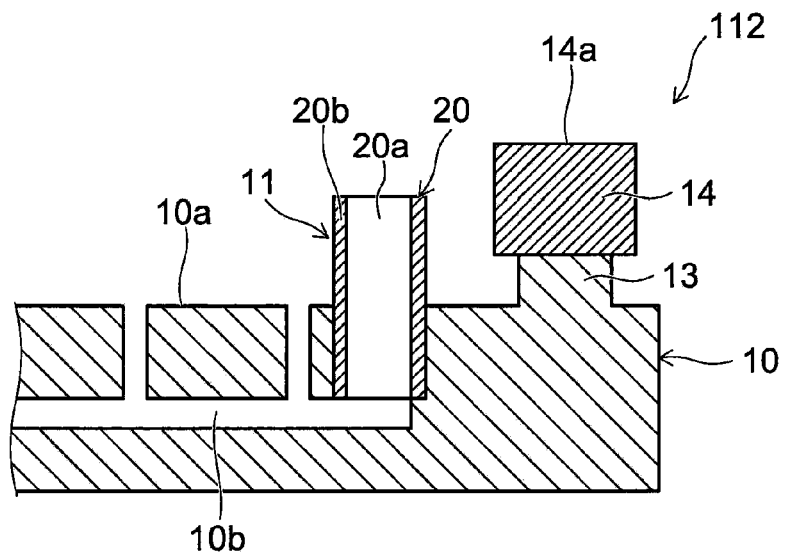
FIG. 6A and FIG. 6B are schematic cross-sectional views illustrating the configuration of a portion of another substrate holding apparatus according to the first embodiment.
Figure 6B:
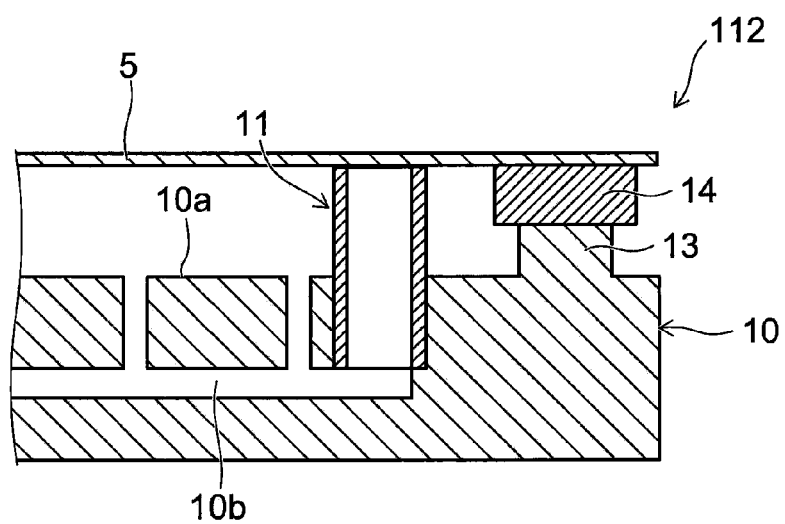

FIG. 6A and FIG. 6B are schematic cross-sectional views illustrating the configuration of a portion of another substrate holding apparatus according to the first embodiment.

In the substrate holding apparatus 112 as illustrated in FIG. 6A, the third support unit 13 includes an elastic body 14. For example, the elastic body 14 is provided on the tip 13a of the third support unit 13. For example, the elastic body 14 has a circular ring configuration. For example, the height of a tip 14a of the elastic body 14 from the major surface 10a is higher than the height from the major surface 10a of the tip portions 20 of the first support units 11 at the reference position. The elastic body 14 may include, for example, a resin material that is elastic.

As illustrated in FIG. 6B, the elastic body 14 is compressed by the substrate 5 that is supported by the multiple first support units 11. For example, the elastic body 14 fills gaps that may occur between the substrate 5 and the main unit 10. For example, the elastic body 14 suppresses the adhesion of impurities to the back surface (the surface opposing the main unit 10) of the substrate 5. For example, in the case where the substrate holding apparatus 112 is used in an immersion-type exposure apparatus, the elastic body 14 suppresses leakage of the immersion liquid (e.g., water) around to the back surface of the substrate 5.

Figures 7A, 7B:
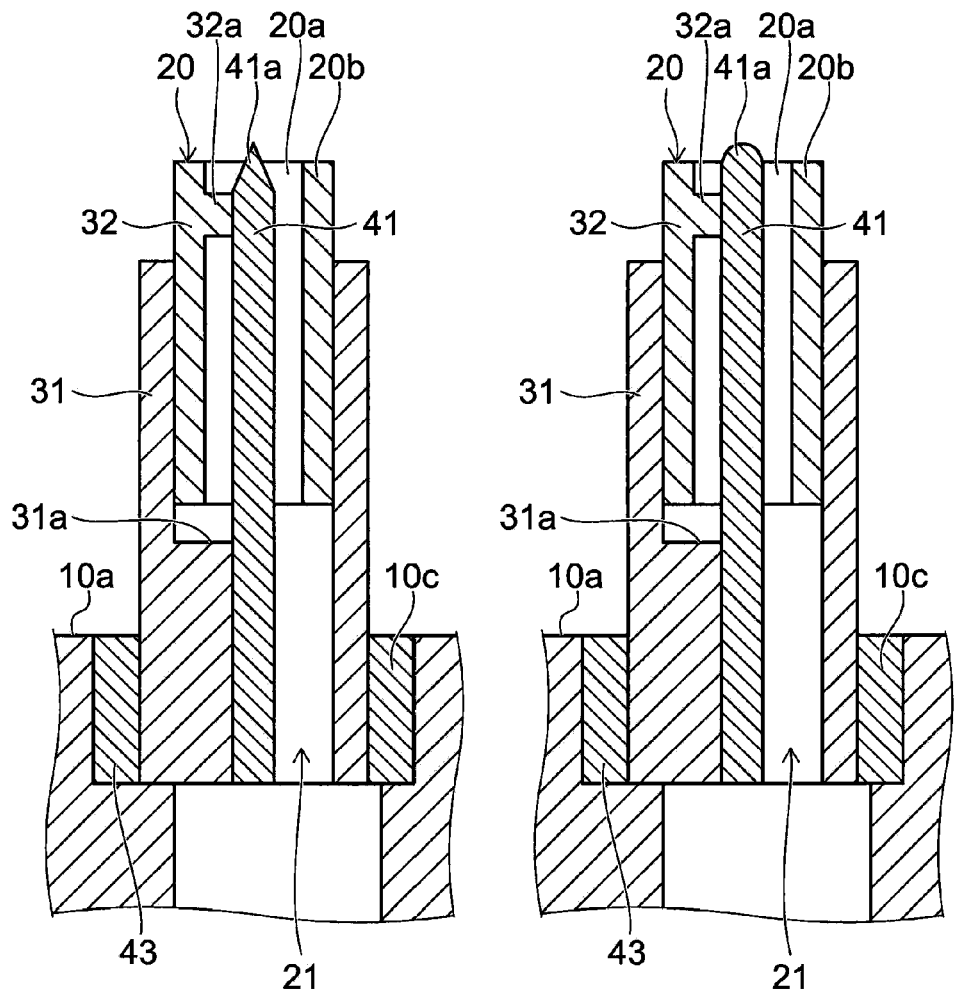
FIG. 7A and FIG. 7B are schematic cross-sectional views illustrating the configuration of portions of other substrate holding apparatuses according to the first embodiment.

FIG. 7A and FIG. 7B are schematic cross-sectional views illustrating the configuration of portions of other substrate holding apparatuses according to the first embodiment.

As illustrated in FIG. 7A, the tip 41a of the first perpendicular direction drive unit 41 may have a sharp triangular configuration when viewed in the Y-axis direction. Thus, the contact surface area with the substrate 5 is smaller than that in the case where the tip 41a is formed in a planar configuration; and the scratching of the substrate 5 can be suppressed more appropriately.

As illustrated in FIG. 7B, the tip 41a of the first perpendicular direction drive unit 41 may have a rounded semicircular configuration when viewed in the Y-axis direction. In such a case as well, the contact surface area with the substrate 5 is smaller than that of the case where the tip 41a is formed in a planar configuration. The tip 41a may have any configuration that considers the scratching of the substrate 5.

Second Embodiment

Figure 8:
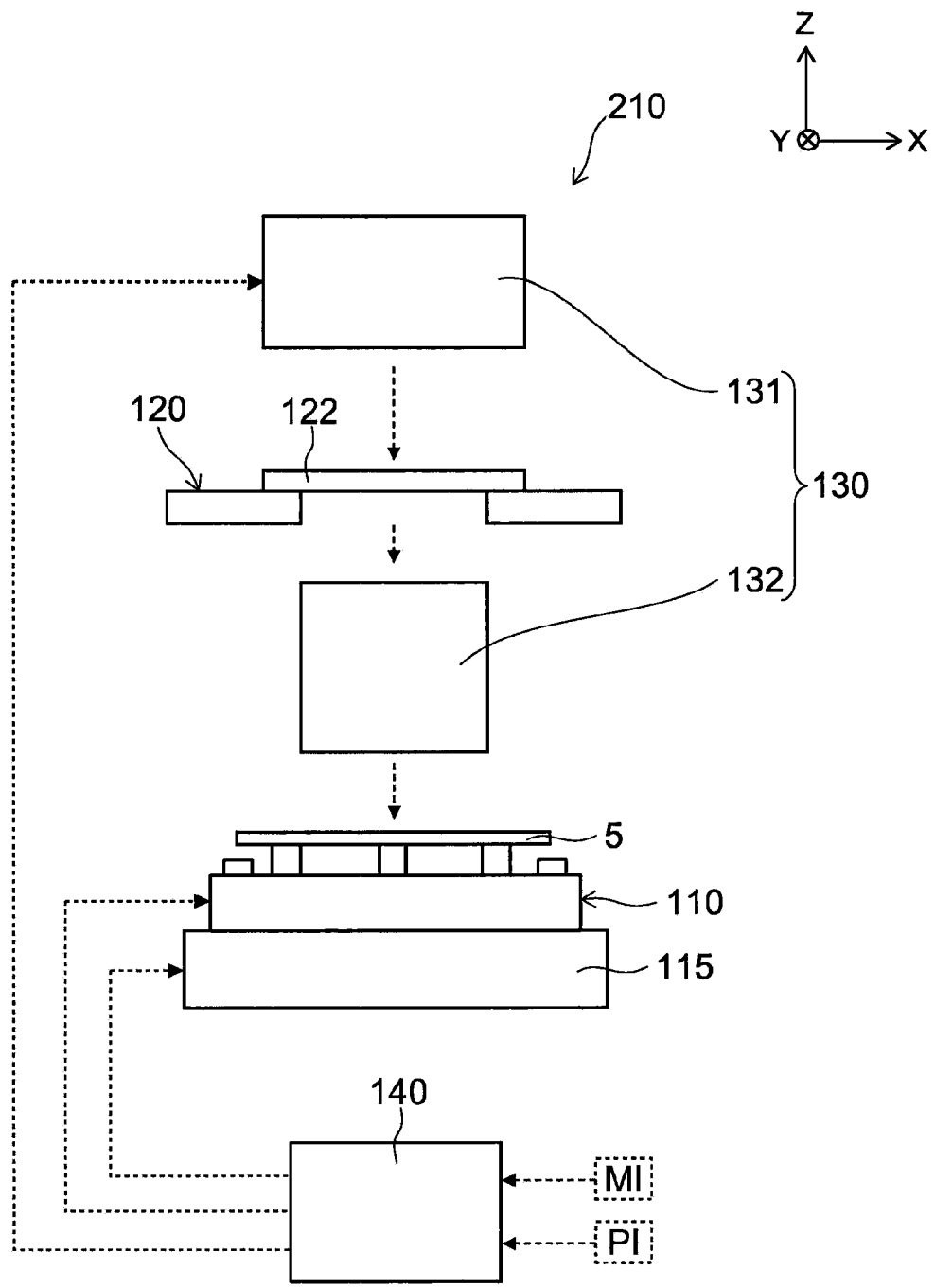
FIG. 8 is a schematic view illustrating the configuration of a pattern transfer apparatus according to a second embodiment.

FIG. 8 is a schematic view illustrating the configuration of a pattern transfer apparatus according to a second embodiment.

As illustrated in FIG. 8, the pattern transfer apparatus 210 includes the substrate holding apparatus 110, a master form holding unit 120, a transfer unit 130, and a control unit 140.

In the substrate holding apparatus 110, the configuration described in the first embodiment can be used. The substrate holding apparatus 110 is mounted to a stage 115. The stage 115 moves the substrate holding apparatus 110 in any direction. For example, the stage 115 moves the substrate holding apparatus 110 between the position where the substrate holding apparatus 110 is caused to hold the substrate 5 and the position where the pattern is transferred onto the substrate 5 that is held.

The master form holding unit 120 attachably and removably holds a master form 122 in which a prescribed pattern is formed. In this example, the master form 122 may include, for example, a transmissive mask.

The transfer unit 130 transfers the pattern that is formed in the master form 122 onto the substrate 5. For example, the transfer unit 130 includes an illumination optical system 131 (the first illumination optical system) and a projection lens 132 (a first projection lens). The illumination optical system 131 irradiates light toward the master form 122 that is held by the master form holding unit 120. The projection lens 132 projects the light passing through the master form 122 toward the substrate 5. Thereby, the pattern that is formed in the master form 122 is transferred onto the substrate 5. In other words, the pattern transfer apparatus 210 is a transmission-type exposure apparatus. In the pattern transfer apparatus 210, a photoresist is pre-coated onto the major surface 5a of the substrate 5 that is held by the substrate holding apparatus 110. The pattern of the master form 122 is transferred onto the photoresist.

For example, the control unit 140 is electrically connected to the substrate holding apparatus 110, the stage 115, and the illumination optical system 131. For example, the control unit 140 controls the operations of the substrate holding apparatus 110, the stage 115, and the illumination optical system 131. In the pattern transfer apparatus 210, the transfer of the pattern onto the substrate 5 is executed by the control of the control unit 140.

In the substrate holding apparatus 110, for example, the driving of the first perpendicular direction drive unit 41, the X-axis direction drive unit 43, the Y-axis direction drive unit 44, and the second perpendicular direction drive unit 52 is controlled by the control unit 140. For example, the control unit 140 individually controls the movement of the tip portions 20 of the multiple first support units 11 in the X-axis direction, the Y-axis direction, and the Z-axis direction.

For example, measurement information MI and positional shift information PI are input to the control unit 140. For example, the control unit 140 controls the substrate holding apparatus 110 based on the measurement information MI and the positional shift information PI that are input. For example, the measurement information MI and the positional shift information PI are input to the control unit 140 prior to causing the substrate holding apparatus 110 to hold the substrate 5. For example, the measurement information MI and the positional shift information PI may be data for each substrate 5 or may be data that is commonly used for the substrates 5 of the same lot. For example, the measurement information MI and the positional shift information PI may be input to the control unit 140 via a network or storage media.

For example, the measurement information MI is information relating to the configuration of the substrate 5 prior to being supported. For example, the measurement information MI is information that indicates the measurement result of the pre-measured configuration of the substrate 5 prior to being supported. For example, the control unit 140 causes the substrate holding apparatus 110 to hold the substrate 5 corresponding to the measurement information MI. For example, the control unit 140 selectively operates at least one of the multiple second support units 12 based on the measurement information MI.

For example, a data table is stored in the control unit 140, where the data table includes the configuration information that indicates the configuration of the substrate 5 that is correlated with combination information that indicates the combination of the optimal second support units 12 for the configuration of the substrate 5. For example, the control unit 140 performs pattern matching to compare the configuration information stored in the data table to the measurement information MI that is input when causing the substrate holding apparatus 110 to hold the substrate 5. Thereby, the configuration of the substrate 5 corresponding to the measurement information MI is designated. The control unit 140 reads the combination information that correlates to the designated configuration by referring to the data table. The control unit 140 drives the second support units 12 that correspond to the combination information.

Thus, for example, the control unit 140 causes the second support units 12 that have the combination suited to the configuration of the substrate 5 based on the combination information to support the substrate 5. For example, as described above, in the case of the substrate 5 that is distorted to protrude upward proximal to the center, the second support units 12 of the second group 12b are caused to support the substrate 5. Thereby, the distortion of the substrate 5 when supported by the multiple first support units 11 can be reduced.

For example, the control unit 140 moves the movable portions 51 of the second support units 12 from the second position to the first position by driving the second perpendicular direction drive unit 52 to cause the substrate 5 to be supported by the multiple first support units 11. For example, the control unit 140 adjusts the height from the major surface 10a and the positions in directions along the X-Y plane for the tip portion 20 of each of the multiple first support units 11 based on the measurement information MI. For example, the control unit 140 reduces the distortion of the substrate 5 by the adjustment. Thereby, for example, in the case where the pattern is transferred onto the substrate 5 by the transfer unit 130, the decrease of the overlay precision caused by the distortion of the substrate 5 is suppressed. The portion of the control unit 140 relating to the control of the substrate holding apparatus 110 may be provided in the substrate holding apparatus 110.

Figure 9A:
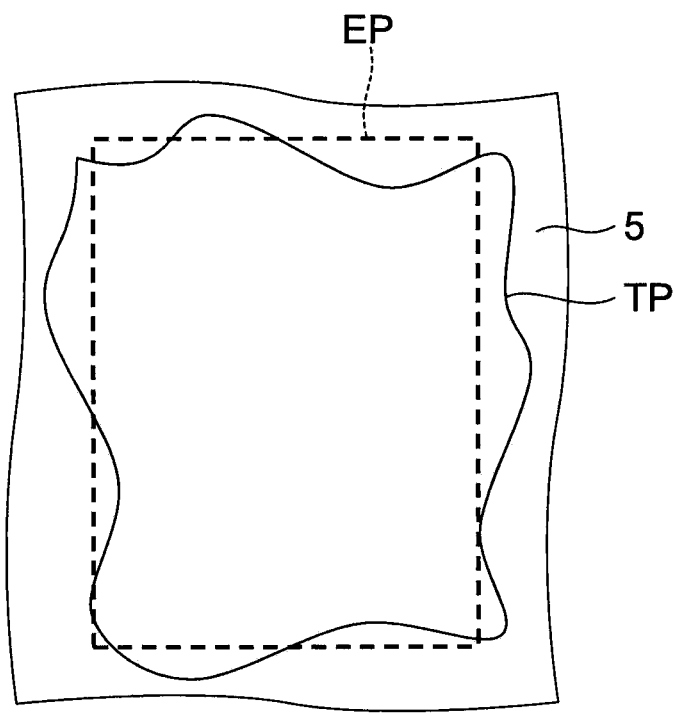
FIG. 9A and FIG. 9B are schematic views illustrating a characteristic of the pattern transfer apparatus according to the second embodiment.
Figure 9B:
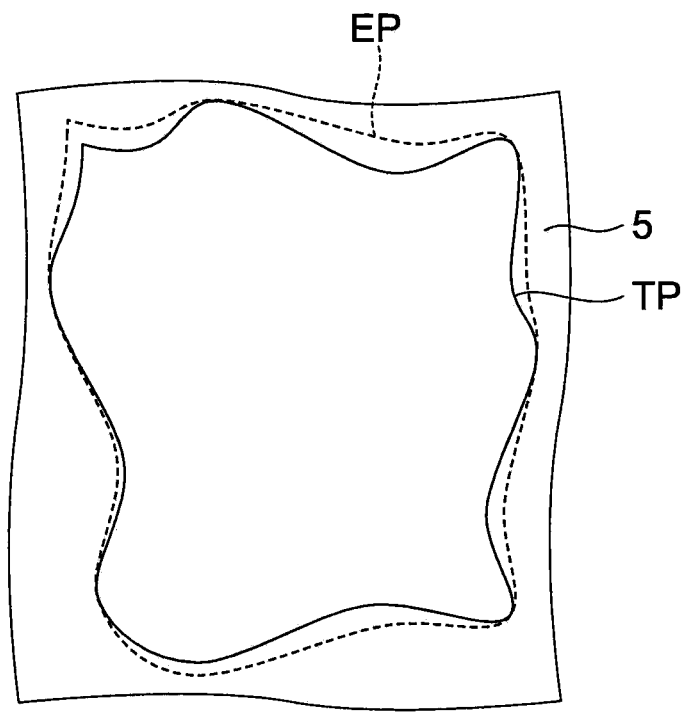

FIG. 9A and FIG. 9B are schematic views illustrating a characteristic of the pattern transfer apparatus according to the second embodiment.

As illustrated in FIG. 9A, a transfer pattern TP to be newly transferred by the transfer unit 130 is shifted from an existing pattern EP that is already formed in the substrate 5 due to, for example, distortion of the projection lens 132 even in the case where the distortion of the substrate 5 is suppressed. In other words, the overlay precision is affected by not only the distortion of the substrate 5 but also, for example, the distortion of the projection lens 132.

For example, the positional shift information PI is information relating to the relative positional shift between the existing pattern EP and the transfer pattern TP. For example, the positional shift information PI is calculated based on optical characteristic data of the projection lens 132 and information of the existing pattern EP. For example, the control unit 140 adjusts the height from the major surface 10a and the positions in directions along the X-Y plane for the tip portion 20 of each of the multiple first support units 11 based on the positional shift information PI.

As illustrated in FIG. 9B, for example, the control unit 140 adjusts the height and the position of the tip portion 20 of each of the multiple first support units 11 to reduce the relative positional shift between the existing pattern EP and the transfer pattern TP. Thereby, for example, the decrease of the overlay precision caused by the distortion of the projection lens 132 also can be suppressed.

The information input to the control unit 140 may be only one selected from the measurement information MI and the positional shift information PI. The control unit 140 may adjust the tip portions 20 using only the measurement information MI. The control unit 140 may adjust the tip portions 20 using only the positional shift information PI. The control unit 140 may adjust the tip portions 20 using both the measurement information MI and the positional shift information PI.

Figure 10:
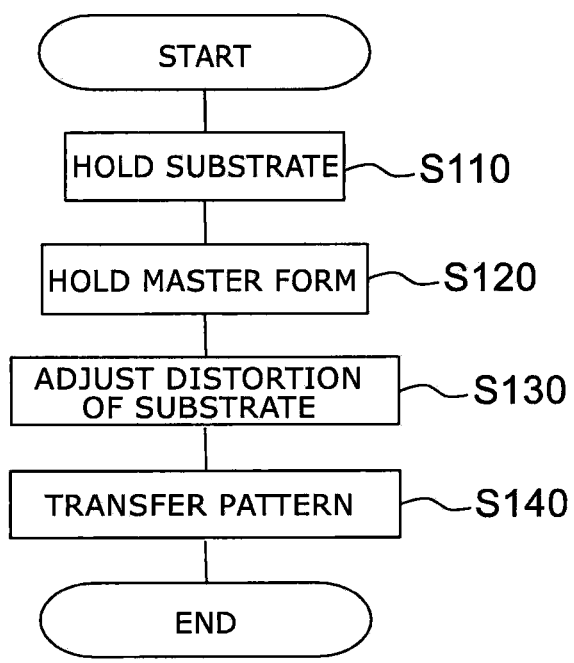
FIG. 10 is a flowchart illustrating a pattern transfer method of the pattern transfer apparatus according to the second embodiment.

FIG. 10 is a flowchart illustrating a pattern transfer method of the pattern transfer apparatus according to the second embodiment.

As illustrated in FIG. 10, the pattern transfer method of the pattern transfer apparatus 210 according to the embodiment includes step S110 of causing the substrate holding apparatus 110 to hold the substrate 5, step S120 of causing the master form holding unit 120 to hold the master form 122, step S130 of adjusting the distortion of the substrate 5 by individually controlling the movements of the tip portions 20 of the multiple first support units 11, and step S140 of transferring the pattern of the master form 122 onto the substrate 5. Step S110 to step S130 can be interchanged within the extent of technical feasibility.

For example, step S110 implements processing to cause the second support units 12 that have the combination suited to the configuration of the substrate 5 based on the measurement information MI to support the substrate 5 and processing to move the movable portions 51 of the second support units 12 from the second position to the first position by driving the second perpendicular direction drive unit 52 to cause the multiple first support units 11 to support the substrate 5.

For example, step S130 may implement processing to adjust the height from the major surface 10a and the positions in directions along the X-Y plane for the tip portion 20 of each of the multiple first support units 11 based on the measurement information MI. For example, step S130 may implement the processing to adjust the height from the major surface 10a and the positions in directions along the X-Y plane for the tip portion 20 of each of the multiple first support units 11 based on the positional shift information PI.

Thereby, in the pattern transfer method of the pattern transfer apparatus 210, the distortion of the substrate 5 that is held is appropriately adjusted. Further, the decrease of the overlay precision of the pattern transfer method of the pattern transfer apparatus 210 is suppressed.

Figure 11:
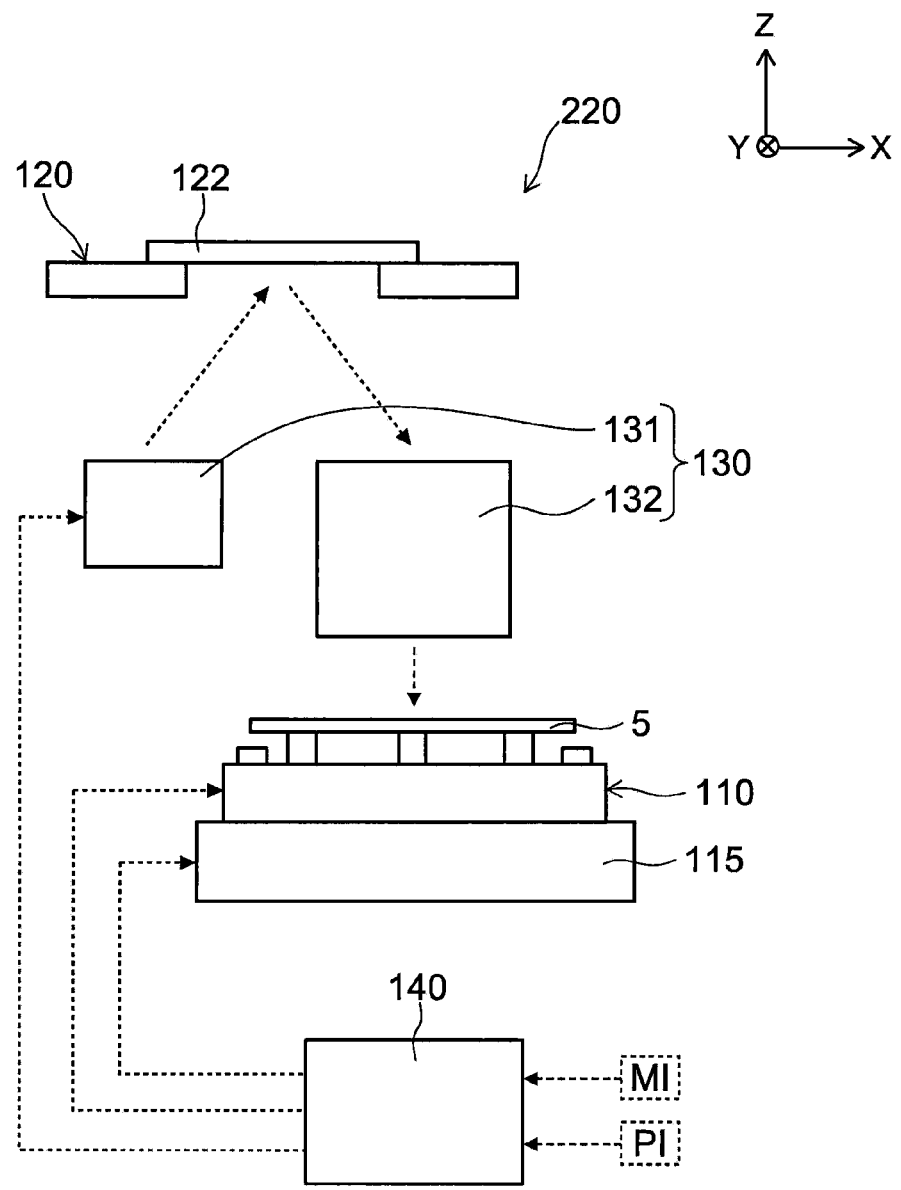
FIG. 11 is a schematic view illustrating the configuration of another pattern transfer apparatus according to the second embodiment.

FIG. 11 is a schematic view illustrating the configuration of another pattern transfer apparatus according to the second embodiment.

As illustrated in FIG. 11, the master form 122 of the pattern transfer apparatus 220 may include, for example, a reflective mask.

The illumination optical system 131 (the second illumination optical system) irradiates light toward the master form 122 that is held by the master form holding unit 120. The projection lens 132 (the second projection lens) projects the light reflected by the master form 122 toward the substrate 5. Thereby, the pattern that is formed in the master form 122 is transferred onto the substrate 5. In other words, the pattern transfer apparatus 220 is a reflection-type exposure apparatus.

In the pattern transfer apparatus 220 as well, the distortion of the substrate 5 that is held is appropriately adjusted by adjusting the height from the major surface 10a and the positions in directions along the X-Y plane for the tip portion 20 of each of the multiple first support units 11. Also, the decrease of the overlay precision is suppressed.

Figure 12:
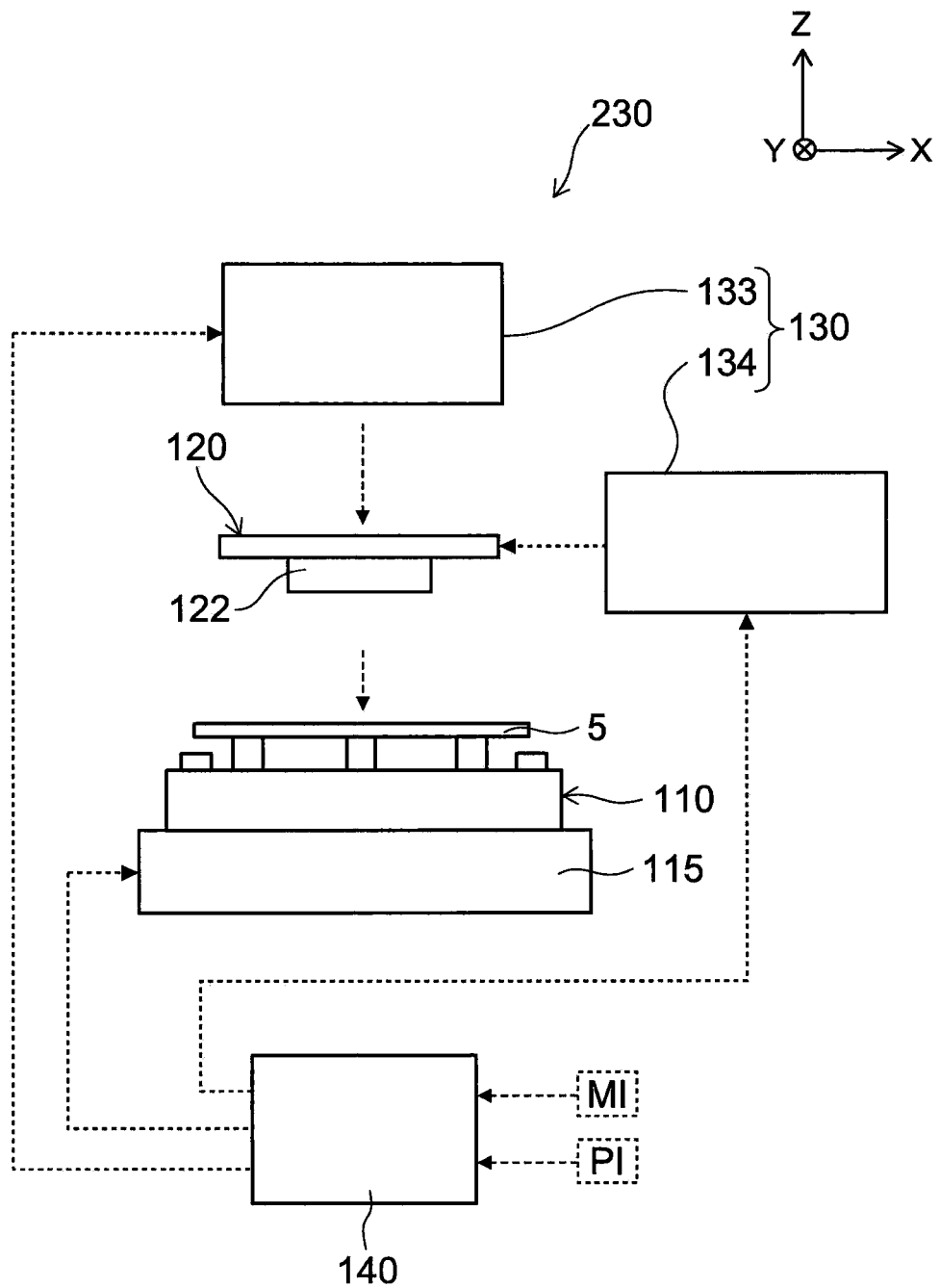
FIG. 12 is a schematic view illustrating the configuration of another pattern transfer apparatus according to the second embodiment.

FIG. 12 is a schematic view illustrating the configuration of another pattern transfer apparatus according to the second embodiment.

As illustrated in FIG. 12, the master form 122 of the pattern transfer apparatus 230 may include, for example, an imprint template.

The transfer unit 130 includes a light source 133 and a template drive unit 134. For example, the light source 133 irradiates ultraviolet light toward the master form 122. For example, the template drive unit 134 causes the master form 122 that is held by the master form holding unit 120 to contact the substrate 5 by moving the master form holding unit 120 in the Z-axis direction.

In the pattern transfer apparatus 230, for example, an ultraviolet-curing resin is coated onto the major surface 5a of the substrate 5 that is held by the substrate holding apparatus 110. The master form 122 is caused to contact the major surface 5a of the substrate 5 on which the resin is coated by driving the template drive unit 134. The resin is cured by the ultraviolet light that is irradiated from the light source 133 and passes through the master form holding unit 120 and the master form 122. Thereby, the pattern having the uneven configuration that is formed in the master form 122 is transferred onto the substrate 5. In other words, the pattern transfer apparatus 230 is an imprint apparatus.

In the pattern transfer apparatus 230 as well, the distortion of the substrate 5 that is held is appropriately adjusted by adjusting the height from the major surface 10a and the positions in directions along the X-Y plane for the tip portion 20 of each of the multiple first support units 11. Also, the decrease of the overlay precision is suppressed.

According to the embodiments, a substrate holding apparatus, a pattern transfer apparatus, and a pattern transfer method that can appropriately adjust the distortion of a substrate that is held are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in substrate holding apparatuses and pattern transfer apparatuses such as main units, first support units, suction-holding units, second support units, third support units, elastic bodies, first measuring units, second measuring units, master form holding units, transfer units, control units, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all substrate holding apparatuses, pattern transfer apparatuses, and pattern transfer methods practicable by an appropriate design modification by one skilled in the art based on the substrate holding apparatuses, the pattern transfer apparatuses, and the pattern transfer methods described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A substrate holding apparatus, comprising:
a main unit having a plate configuration having a major surface; and
a plurality of first support units disposed on the major surface, each of the first support units including a first perpendicular direction drive unit, a second direction driver unit, and a suction-holding unit, the first perpendicular direction drive unit being configured to move the suction-holding unit in a first direction perpendicular to the major surface, the second direction drive unit being configured to move the suction-holding unit in a second direction parallel to the major surface, the suction-holding unit being capable of holding a substrate by suction to transfer a pattern, and individually moveable along the first direction and the second direction according to the pattern transferring to the substrate.

2. The apparatus according to claim 1, wherein the suction-holding unit is also movable in a third direction perpendicular to the first direction and the second direction.

3. The apparatus according to claim 2, wherein the first support units further include:

a third direction drive unit configured to move the suction-holding unit in the third direction.

4. The apparatus according to claim 3, wherein the first perpendicular direction drive unit, the second direction drive unit, and the third direction drive unit include a piezoelectric element.

5. The apparatus according to claim 1, further comprising a plurality of second support units disposed on the major surface, the second support units being movable along the first direction, the suction-holding unit being movable along the first direction between a first state in which a height of the suction-holding unit along the first direction from the major surface is low and a second state in which the height of the suction-holding unit along the first direction from the major surface is higher than in the first state, an end of the second support units in a direction from a position of the suction-holding unit in the first state toward a position of the suction-holding unit in the second state having: a third state in which a height of the end along the first direction from the major surface is lower than the height in the second state; and a fourth state in which the height of the end along the first direction from the major surface is higher than the height in the second state.

6. The apparatus according to claim 5, wherein the second support units include: a movable portion extending along the first direction; and a second perpendicular direction drive unit configured to move the movable portion in the first direction.

7. The apparatus according to claim 1, further comprising a third support unit disposed on the major surface, the third support unit being configured to support a peripheral portion of the substrate.

8. The apparatus according to claim 7, wherein the third support unit includes an elastic body configured to be compressed by the substrate held by the suction-holding unit.

9. The apparatus according to claim 8, wherein the third support unit has a circular configuration surrounding the first support units.

10. The apparatus according to claim 1, further comprising a first measuring unit configured to measure a height of the suction-holding unit from the major surface.

11. The apparatus according to claim 1, further comprising a second measuring unit configured to measure a position of the suction-holding unit in the second direction.

12. A pattern transfer apparatus, comprising:

a substrate holding apparatus including a main unit having a plate configuration having a major surface, and a plurality of first support units disposed on the major surface, each of the first support units including a first perpendicular direction drive unit, a second direction driver unit, and a suction-holding unit, the first perpendicular direction drive unit being configured to move the suction-holding unit in a first direction perpendicular to the major surface, the second direction drive unit being configured to move the suction-holding unit in a second direction parallel to the major surface, the suction-holding unit being capable of holding a substrate by suction to transfer a pattern, and individually moveable along the first direction and the second direction according to the pattern transferring to the substrate;

a master form holding unit configured to attachably and removably hold a master form, the pattern being formed in the master form;

a transfer unit configured to transfer the pattern onto the substrate; and a control unit configured to control movement of the suction-holding unit in the first direction and the second direction for each of the first support units.

13. The apparatus according to claim 12, wherein:

the substrate holding apparatus further includes a plurality of second support units disposed on the major surface, the second support units being movable along the first direction;

the suction-holding unit is movable along the first direction between a first state in which a height of the suction-holding unit along the first direction from the major surface is low and a second state in which the height of the suction-holding unit along the first direction from the major surface is higher than in the first state;

an end of the second support units in a direction from a position of the suction-holding unit in the first state toward a position of the suction-holding unit in the second state has: a third state in which a height of the end along the first direction from the major surface is lower than the height in the second state; and a fourth state in which the height of the end along the first direction from the major surface is higher than the height in the second state; and the control unit is configured to selectively operate at least one of the second support units based on measurement information including a pre-measured configuration of the substrate prior to being supported.

14. The apparatus according to claim 12, wherein the control unit is configured to adjust a height of the suction-holding unit from the major surface and a position of the suction-holding unit in the second direction based on information relating to a configuration of the substrate prior to being supported.

15. The apparatus according to claim 12, wherein the control unit is configured to adjust a height of the suction-holding unit from the major surface and a position of the suction-holding unit in the second direction based on positional shift information relating to a relative positional shift between a first pattern already formed in the substrate and a second pattern to be newly transferred by the transfer unit.

16. The apparatus according to claim 12, wherein the transfer unit includes a first illumination optical system configured to irradiate light toward the master form held by the master form holding unit, and a first projection lens configured to project the light passing through the master form toward the substrate.

17. The apparatus according to claim 12, wherein the transfer unit includes a second illumination optical system configured to irradiate light toward the master form held by the master form holding unit, and a second projection lens configured to project the light passing through the master form toward the substrate.

18. The apparatus according to claim 12, wherein the transfer unit includes a light source configured to irradiate light toward the master form held by the master form holding unit, and a template drive unit configured to move the master form holding unit in the first direction to cause the master form held by the master form holding unit to contact the substrate.

19. The apparatus according to claim 18, wherein the light irradiated from the light source includes ultraviolet light to cure a resin.

20. A pattern transfer method that uses a pattern transfer apparatus, the pattern transfer apparatus including:
　a substrate holding apparatus including
　　a main unit having a plate configuration having a major surface, and
　　a plurality of first support units disposed on the major surface, each of the first support units including a first perpendicular direction drive unit, a second direction driver unit, and a suction-holding unit,
　　　the first perpendicular direction drive unit being configured to move the suction-holding unit in a first direction perpendicular to the major surface,
　　　the second direction drive unit being configured to move the suction-holding unit in a second direction parallel to the major surface,
　　　the suction-holding unit being capable of holding a substrate by suction to transfer a pattern, and individually moveable along the first direction and the second direction according to the pattern transferring to the substrate;
　a master form holding unit configured to attachably and removably hold a master form, a pattern being formed in the master form;
　a transfer unit configured to transfer the pattern onto the substrate; and
　a control unit configured to control movement of the suction-holding unit in the first direction and the second direction for each of the first support units, the method comprising:
　　causing the substrate holding apparatus to hold the substrate;
　　causing the master form holding unit to hold the master form;
　　adjusting distortion of the substrate by controlling the movement of the suction-holding unit in the first direction and the second direction for each of the first support units; and
　　transferring the pattern onto the substrate.

\* \* \* \* \*